(12) United States Patent
Bae et al.

(10) Patent No.: US 11,804,367 B2
(45) Date of Patent: Oct. 31, 2023

(54) PLASMA PROCESSING EQUIPMENT

(71) Applicant: Samsung Electronics Co., Ltd., Suwon-si (KR)

(72) Inventors: Seok Hwan Bae, Seongnam-si (KR);
Dong Hoon Kim, Daejeon (KR);
Byeong Sang Kim, Hwaseong-si (KR);
Hak Young Kim, Bucheon-si (KR);
Hee Won Min, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 229 days.

(21) Appl. No.: 17/221,891

(22) Filed: Apr. 5, 2021

(65) Prior Publication Data

US 2022/0068613 A1     Mar. 3, 2022

(30) Foreign Application Priority Data

Sep. 1, 2020 (KR) ........................ 10-2020-0111007

(51) Int. Cl.
    *H01J 37/32*      (2006.01)
    *H01L 21/687*      (2006.01)
    *H01L 21/683*      (2006.01)

(52) U.S. Cl.
CPC .. *H01J 37/32642* (2013.01); *H01J 37/32633* (2013.01); *H01J 37/32715* (2013.01);
(Continued)

(58) Field of Classification Search
CPC .......... H01J 37/32642; H01J 37/32633; H01J 37/32715; H01J 2237/0206;
(Continued)

(56) References Cited

U.S. PATENT DOCUMENTS 6,040,011 A * 3/2000 Yudovsky ......... H01L 21/68792
                                                        118/728
6,159,299 A * 12/2000 Koai ................. H01L 21/67017
                                                        118/728

(Continued)

FOREIGN PATENT DOCUMENTS

| KR | 100783060 B1 | 12/2007 |
| KR | 20090057546 A | 6/2009 |
| KR | 20100080883 A | 7/2010 |

*Primary Examiner* — Charlee J. C. Bennett
(74) *Attorney, Agent, or Firm* — Muir Patent Law, PLLC

(57) ABSTRACT

Provided is plasma processing equipment comprising a substrate support, a focus ring disposed along an edge of the upper surface of the substrate support and including a fluid hole passing through a main body, an insulating ring surrounding an outer sidewall of the substrate support and including an inner side surface facing the outer sidewall of the substrate support, an outer side surface, and an upper surface connecting the inner and outer side surfaces, and including upper and lower end portions having different heights, and a connection end portion connecting the upper and lower end portions, a liner surrounding the outer side surface of the insulating ring and a baffle disposed on an upper surface of the liner, wherein a fluid passing through the fluid hole flows along the upper surface, and the baffle generates a pressure difference of the fluid between the upper and lower end portions.

20 Claims, 13 Drawing Sheets

(52) U.S. Cl.
CPC .... *H01L 21/6833* (2013.01); *H01L 21/68735* (2013.01); *H01J 2237/0206* (2013.01); *H01J 2237/2007* (2013.01); *H01J 2237/334* (2013.01)

(58) Field of Classification Search
CPC ........ H01J 2237/2007; H01J 2237/334; H01L 21/6833; H01L 21/68735
USPC .................................................. 156/345.51
See application file for complete search history.

(56) References Cited

U.S. PATENT DOCUMENTS

| | | | |
|---|---|---|---|
| 7,727,354 B2 * | 6/2010 | Park | H01L 21/68735 156/345.43 |
| 10,497,597 B2 | 12/2019 | Lee et al. | |
| 10,672,629 B2 | 6/2020 | Kim et al. | |
| 11,104,991 B2 * | 8/2021 | Kamio | C23C 16/45502 |
| 2004/0069227 A1 * | 4/2004 | Ku | C23C 16/4585 118/721 |
| 2004/0261946 A1 * | 12/2004 | Endoh | H01L 21/6831 156/345.1 |
| 2005/0103440 A1 * | 5/2005 | Sato | H01J 37/3405 156/345.29 |
| 2007/0193688 A1 * | 8/2007 | Dhindsa | C23C 16/4585 156/345.43 |
| 2008/0182412 A1 * | 7/2008 | Bailey, III | H01L 21/0209 156/345.43 |
| 2015/0109716 A1 * | 4/2015 | Konno | H01J 37/32311 361/234 |
| 2017/0053820 A1 | 2/2017 | Bosch et al. | |
| 2017/0213758 A1 * | 7/2017 | Rice | H01J 37/32082 |
| 2018/0090344 A1 * | 3/2018 | Kim | H01J 37/32642 |
| 2019/0172688 A1 | 6/2019 | Ueda | |
| 2020/0020565 A1 * | 1/2020 | Rathnasinghe | H01J 37/32807 |
| 2020/0066495 A1 | 2/2020 | Noorbakhsh et al. | |

* cited by examiner

Fig. 12

| d | 110ER Flow velocity [m/s] | 410PV Flow velocity [m/s] | 410PV Flow Rate [kg/s] |
|---|---|---|---|
| Non-410PV | 0 | ~ | ~ |
| 15mm | 0.0235 | 0.00628 | $3.30E^{-10}$ |
| 30mm | 0.0233 | 0.00541 | $2.85E^{-10}$ |

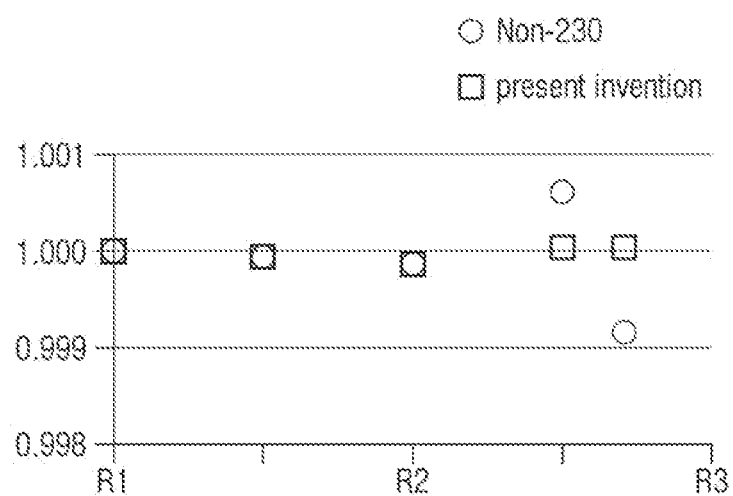

PLASMA PROCESSING EQUIPMENT

This application claims priority under 35 U.S.C. § 119 from Korean Patent Application No. 10-2020-0111007 filed on Sep. 1, 2020, in the Korean Intellectual Property Office, the disclosure of which is incorporated herein by reference in its entirety.

BACKGROUND

1. Field of the Disclosure

The present disclosure relates to plasma processing equipment.

2. Description of the Related Art

As the internal miniaturization and high-integration of next-generation devices proceeds, the difficulty of processing for such devices increases. Specifically, it is required to maintain uniformity even in an edge region of a substrate.

In conventional semiconductor manufacturing equipment and plasma processing equipment, due to structures such as a focus ring, an electrostatic chunk, and the like, a decrease in a flow rate of etching gas, turbulence, and voltage tilting can occur in the vicinity of the edge region, and the above-described phenomena can cause deterioration of uniformity in the edge region.

SUMMARY

The present disclosure is directed to providing plasma processing equipment in which a space through which fluid may pass is expanded to enhance process uniformity in an edge region.

The present disclosure is also directed to providing plasma processing equipment in which an electrode region is expanded to improve a voltage tilting phenomenon.

The present disclosure is also directed to providing plasma process equipment with an improved arcing prevention layer which prevents an arcing phenomenon due to the expanded electrode region.

Technical problems of the present disclosure are not limited to the above-mentioned technical problems, and other technical problems which are not mentioned may be apparently understood from the following descriptions by those skilled in the art.

According to the aforementioned and other embodiments of the present disclosure, there is provided a plasma processing equipment comprising a substrate support having an upper surface on which a substrate is seat, a focus ring disposed in a ring shape along an edge of the upper surface of the substrate support, and including a fluid hole passing through a main body, an insulating ring surrounding an outer sidewall of the substrate support and including an inner side surface facing the outer sidewall of the substrate support, an outer side surface facing the inner side surface, and an upper surface connecting the inner side surface and the outer side surface, wherein the upper surface includes an upper end portion and a lower end portion having different heights, and a connection end portion connecting the upper end portion and the lower end portion, a liner surrounding the outer side surface of the insulating ring and a baffle disposed on an upper surface of the liner, wherein a fluid passing through the fluid hole flows along the upper surface, and wherein the baffle generates a pressure difference of the fluid between the upper end portion and the lower end portion.

According to the aforementioned and other embodiments of the present disclosure, there is provided a plasma processing equipment comprising a substrate support including an upper surface on which a substrate is seated, and a lower electrode disposed under the substrate, a focus ring disposed in a ring shape along an edge of the upper surface of the substrate support, and including a lower focus ring configured to support at least a part of the substrate, and an upper focus ring separated from the lower focus ring and having at least a part disposed on the lower focus ring, an electrode expanding ring disposed under the lower focus ring, and having an upper surface disposed higher than or equal to an upper surface of the lower electrode and a mover passing through the electrode expanding ring, and disposed under the upper focus ring to adjust a height of the upper focus ring.

According to the aforementioned and other embodiments of the present disclosure, there is provided a plasma processing equipment comprising a chamber in which a process is performed, a substrate support configured to support a substrate in the chamber, and configured to support at least a part of a focus ring disposed in a ring shape along an edge of the substrate, wherein the focus ring includes a fluid hole, an electrode expanding ring disposed between the focus ring and the substrate support in a separable form, and having an upper surface disposed higher than or equal to an upper surface of a lower electrode included in the substrate support, an insulating ring surrounding an outer sidewall of the electrode expanding ring and including an inner side surface facing the outer sidewall of the electrode expanding ring, an outer side surface facing the inner side surface, and an upper surface connecting the inner side surface and the outer side surface, wherein the upper surface includes an upper end portion and a lower end portion having different heights, and a connection end portion connecting the upper end portion and the lower end portion, an outer ring disposed on the insulating ring in a ring shape along an edge of the focus ring and a baffle disposed in a ring shape along an edge of the outer ring, wherein a fluid passing through the fluid hole flows along the upper surface from a space between the insulating ring and the outer ring, and the baffle generates a pressure difference of the fluid between the upper end portion and the lower end portion.

BRIEF DESCRIPTION OF THE DRAWINGS

The above and other aspects and features of the present disclosure will become more apparent by describing in detail exemplary embodiments thereof with reference to the attached drawings, in which:

FIGS. 12 and 13 are views for describing an effect of the plasma processing equipment, according to example embodiments of the present disclosure.

DETAILED DESCRIPTION OF THE EMBODIMENTS

Figure 1:
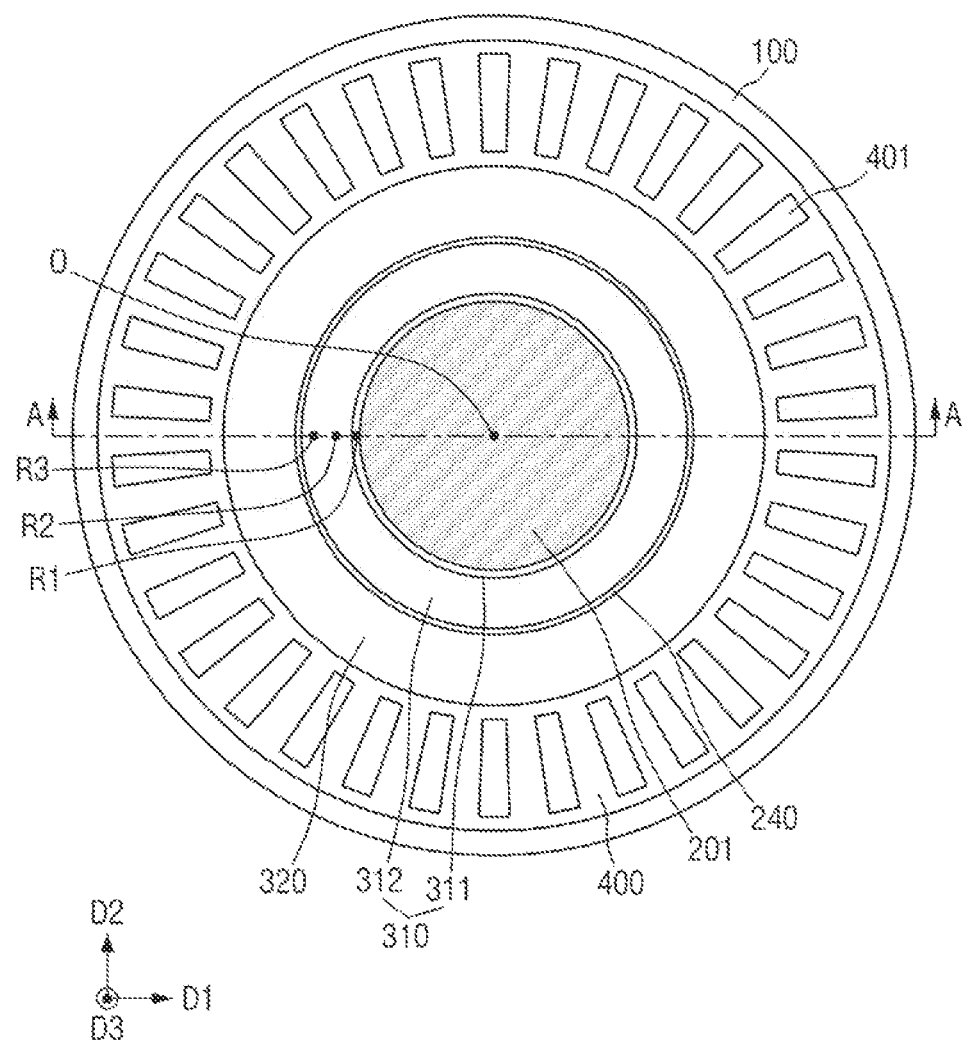
FIG. 1 is a plan view for describing plasma processing equipment, according to example embodiments of the present disclosure.

Hereinafter, embodiments according to the technical spirit of the present disclosure will be described with reference to the accompanying drawings. In descriptions of FIGS. 1 to 13, the same reference numerals are used for substantially the same components, and overlapping description of the components will be omitted. Further, similar reference symbols are used for similar components throughout the drawings.

Figure 2:
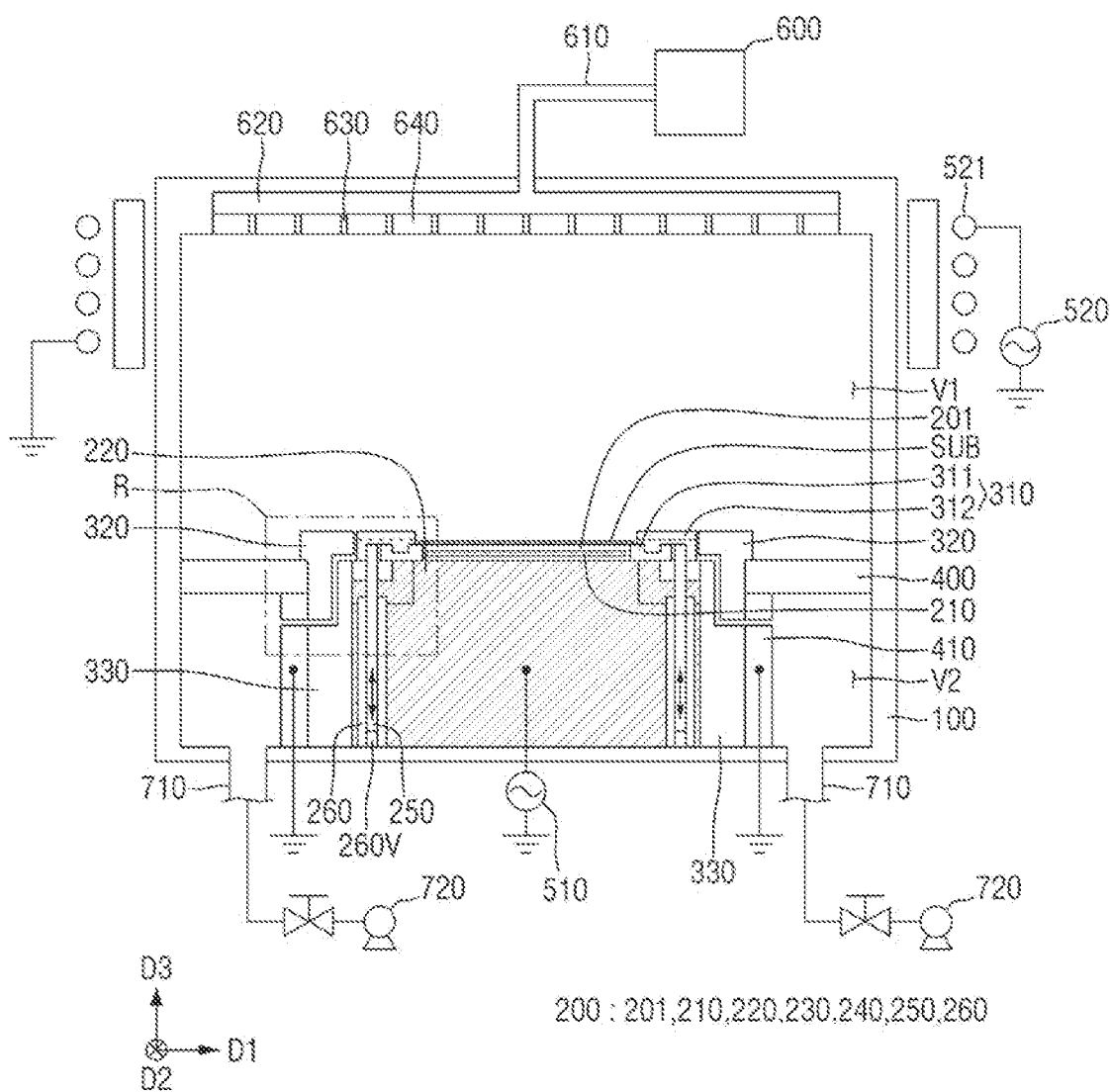
FIG. 2 is a cross-sectional view of a cross-section taken along line A-A in FIG. 1.
Figure 3:
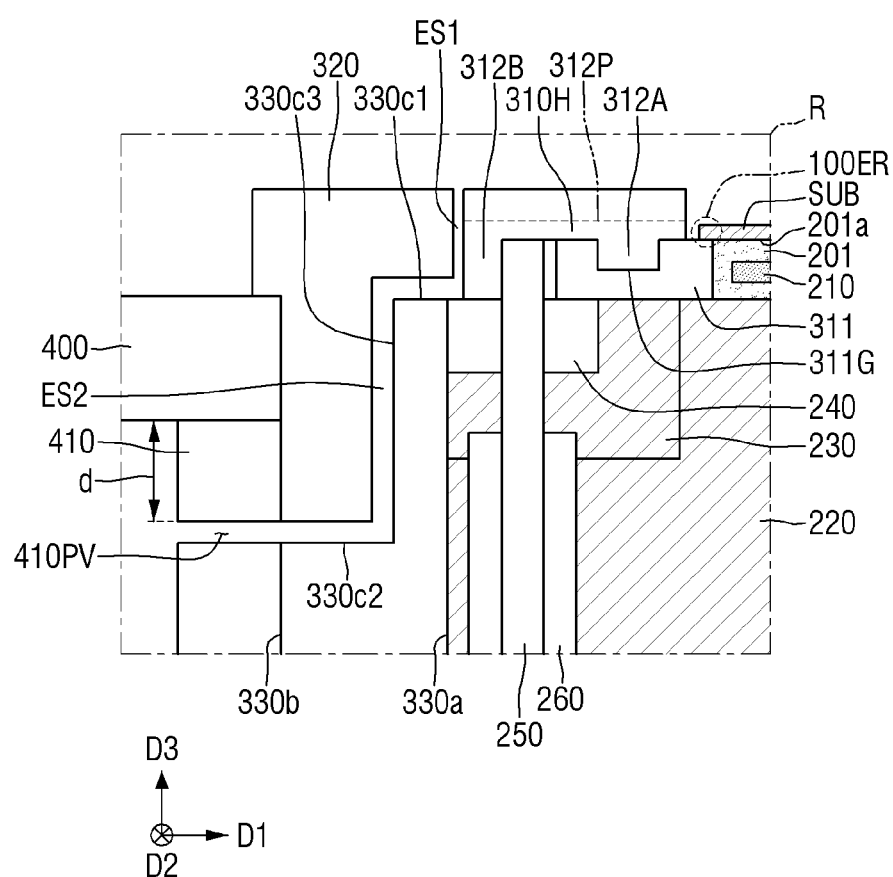
FIG. 3 is an enlarged view of region R in FIG. 2.
Figure 4:
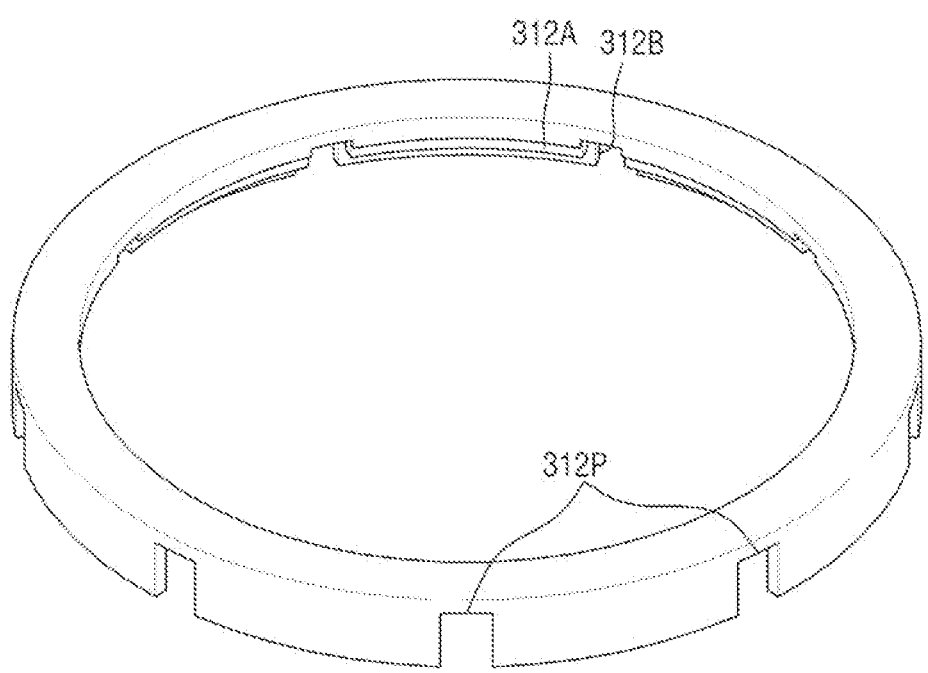
FIG. 4 is a perspective view for describing a focus ring, according to example embodiments of the present disclosure.

FIG. 1 is a plan view for describing plasma processing equipment 1 according to example embodiments of the present disclosure. FIG. 2 is a cross-sectional view of a cross-section taken along line A-A in FIG. 1. FIG. 3 is an enlarged view of region R in FIG. 2. FIG. 4 is a perspective view for describing a focus ring according to example embodiments of the present disclosure.

Referring to FIGS. 1 to 4, the plasma processing equipment 1 according to example embodiments of the present disclosure may include a chamber 100, a substrate support 200, a focus ring 310, an outer ring 320, an insulating ring 330, a baffle 400, a liner 410, and the like.

In the chamber 100, the substrate support 200 which supports a substrate SUB such as a semiconductor wafer, the focus ring 310 surrounding an outer periphery of an upper surface 201a of the substrate support 200, the outer ring 320 surrounding an outer periphery of the focus ring 310, the insulating ring 330 surrounding an outer sidewall of the substrate support 200, the baffle 400 surrounding the outer ring 320, and the liner 410 disposed under the baffle 400 may be disposed.

The chamber 100 may include a conductive member such as aluminum according to the embodiment, and a coil 521 surrounding an outer side surface in a spiral shape is provided on an outer side of an upper portion, and the coil 521 is connected to a high-frequency power supply 520 which applies power for a source through a matching device (not shown).

A gas supply pipe 610 providing a process gas for the substrate SUB into the chamber 100 is provided in an upper portion of the chamber 100. The process gas includes an etching gas, but is not limited thereto. The gas supply pipe 610 is connected to a gas shower head 640 in which a plurality of gas diffusion holes 630 are formed through a buffer chamber 620, and injects a predetermined process gas toward the substrate SUB mounted on an electrostatic chuck 201. The gas supply pipe is connected to a gas supply 600 at the outside of the chamber 100, and the gas supply supplies the process gas to the chamber 100.

A discharge port 710 is formed in a lower portion of the chamber 100, and the discharge port 710 is connected to a vacuum pump 720 such as a dry pump. A generated material such as a polymer generated during an etching process is discharged through the discharge port 710.

The substrate support 200 may include the electrostatic chuck 201, an inner electrode 210, a lower electrode 220, an electrode expanding ring 230, an arcing prevention ring 240, a mover 250, and a mover holder 260. The substrate support 200 may have a cylindrical shape, a central portion as a partial region of the substrate support 200 may protrude, and the electrostatic chuck 201 fixes the substrate SUB to a region protruding from the substrate support 200.

The electrostatic chuck 201 includes the upper surface 201a on which the substrate SUB is seated, and includes a conductive member such as aluminum, and the inner electrode 210 is formed in the electrostatic chuck 201. The inner electrode 210 is connected to an external DC power supply (not shown) and as a DC voltage is applied, the substrate SUB is electrostatically adsorbed on the electrostatic chuck 201 by an electrostatic force. The substrate SUB may be fixed to the lower electrode 220 using the force of static electricity, and the electrostatic chuck 201 horizontally fixes the substrate SUB such as a wafer or the like or horizontally maintains a glass substrate of a liquid crystal display (LCD).

The lower electrode 220 may be disposed under the electrostatic chuck 201. The lower electrode 220 may support the electrostatic chuck 201, the electrode expanding ring 230, and the focus ring 310, and a part of a center region which supports the electrostatic chuck 201 may protrude.

The lower electrode 220 may include a conductive member such as aluminum, but is not limited thereto. High frequency power may be applied to an upper electrode and the lower electrode 220, which are installed to be spaced apart from each other at a predetermined interval in an enclosed inner space of the chamber 100, through a high frequency power supply 510 to form an electric field, activate the process gas supplied into the enclosed space using an electric field, and convert the process gas to a plasma state.

The electrode expanding ring 230 may be disposed in a ring shape along a non-protruding portion of the upper surface of the lower electrode 220. Accordingly, the electrode expanding ring 230 may be disposed between the focus ring 310 and the lower electrode 220. Like the lower electrode 220, the electrode expanding ring 230 may include a conductive member such as aluminum, but is not limited thereto, and may be separated from the lower electrode 220. A height of a top surface of the electrode expanding ring 230 according to some embodiments may be greater than or equal to a height of the upper surface of the lower electrode 220. According to the embodiment, the top surface of the electrode expanding ring 230 may match the upper surface 201a of the electrostatic chuck 201.

The arcing prevention ring 240 may be disposed between the electrode expanding ring 230 and the focus ring 310 and/or between the electrode expanding ring 230 and the outer ring 320. Further, a partial region of the arcing prevention ring 240 may not overlap the focus ring 310 and the outer ring 320 in a plan view. For example, the partial region of the arcing prevention ring 240 may be exposed to an upper space V1 in the chamber 100 through a first empty space ES1 between the focus ring 310 and the outer ring 320.

The arcing prevention ring 240 is a layer which prevents arcing of the electrode expanding ring 230 from occurring through the upper space V1 in the chamber 100, and may include fluoro rubber which may be sealed with an insulating material such as silicon carbide (SiC) or the like. Here, the fluoro rubber may be at least one of Viton. HNBR, and NBR.

The mover 250 may adjust a height of the focus ring 310, which will be described later, through the lower electrode 220, the electrode expanding ring 230, and the arcing prevention ring 240. Specifically, the mover 250 according to some embodiments may adjust a height of an upper focus ring 312 to adjust the height relationship between the upper focus ring 312 and the outer ring 320.

The mover 250 may adjust the height of the upper focus ring 312 by moving up and down in a third direction D3 through the mover holder 260 disposed in the lower electrode 220. The mover 250 may move in the third direction D3 along a vertical movement space 260V in the mover holder 260.

The focus ring 310 may be disposed in a ring shape along the outer periphery of the upper surface 201a of the substrate support 200. The focus ring 310 may be formed of a dielectric material or an insulating material to uniformly transmit an electric field on the substrate SUB, and may include both a dielectric material and an insulating material in different embodiments. The focus ring 310 may include, for example, at least one of aluminum oxide ($Al_2O_3$), aluminum nitride (AlN), silicon (Si), silicon oxide ($SiO_2$), quartz, silicon carbide (SiC), and yttrium oxide ($Y_2O_3$).

The focus ring 310 according to some embodiments may include a lower focus ring 311 which supports at least a part of the substrate SUB, and the upper focus ring 312 separable from the lower focus ring 311 and at least partially disposed on the lower focus ring 311. For example, the lower focus ring 311 may be disposed adjacent to and in contact with an outer surface of the electrostatic chuck 201, and at least part of the upper focus ring 312 may be disposed on and in contact with the lower focus ring 311. As used herein, the terms "contact," "contacting," and "in contact with" refer to a direct connection (i.e., touching) unless the context indicates otherwise.

Referring to FIG. 4, the upper focus ring 312 may include a first protruding portion 312A, a second protruding portion 312B, and a plurality of through patterns 312P. The first protruding portion 312A of the upper focus ring 312 according to some embodiments may be disposed in a groove 311G of the lower focus ring 311, and the second protruding portion 312B may be disposed on an upper surface of the arcing prevention ring 240. Accordingly, a protruding distance of the first protruding portion 312A of the upper focus ring 312 according to some embodiments may not be greater than a protruding distance of the second protruding portion 312B.

The plurality of through patterns 312P of the upper focus ring 312 and the lower focus ring 311 according to some embodiments may be coupled to each other, to form a fluid hole 310H of the focus ring 310 through which fluid such as a process gas or the like may pass.

Further, the upper focus ring 312 may be spaced apart from the substrate SUB, and an outermost region 100ER, which is a space between the upper focus ring 312 and the substrate SUB, may be formed on the lower focus ring 311.

The outer ring 320 may be arranged in a ring shape along the outer periphery of the upper focus ring 312 to uniformly transmit an electric field over a wide region, and a partial region of the outer ring 320 may be supported and fixed by the baffle 400. Further, since the height of the upper focus ring 312 is adjusted by the mover 250, the upper surface of the outer ring 320 and the upper surface of the upper focus ring 312 may match. The outer ring 320 may be spaced apart from the upper focus ring 312.

The outer ring 320 may be formed of a dielectric material or an insulating material in order to uniformly transmit an electric field, and may include both a dielectric material and an insulating material in different embodiments. The focus ring 310 may include, for example, at least one of aluminum oxide ($Al_2O_3$), aluminum nitride (AlN), silicon (Si), silicon oxide ($SiO_2$), quartz, silicon carbide (SiC), and yttrium oxide ($Y_2O_3$).

The insulating ring 330 may be disposed under the outer ring 320 and may be disposed in a ring shape surrounding an outer sidewall of the substrate support 200. The insulating ring 330 may prevent the occurrence of arcing due to exposure of the lower electrode 220 and the electrode expanding ring 230 to the outside, and may include an insulating material. The insulating material may include silicon oxide ($SiO_2$), silicon carbide (SiC), and quartz.

The insulating ring 330 connects an inner side surface 330a facing the outer sidewall of the substrate support 200, an outer side surface 330b facing the inner side surface 330a, and an upper surface which connects the inner side surface 330a and the outer side surface 330b. The upper surface of the insulating ring 330 may include an upper end portion 330c1 and a lower end portion 330c2 having different heights, and a connection end portion 330c3 which connects the upper end portion and the lower end portion. The upper end portion 330c1 and the lower end portion 330c2 may be parallel to one another, and the connection end portion 330c3 may be perpendicular to the upper end portion 330c1 and the lower end portion 330c2.

The upper surface of the insulating ring 330 may be spaced apart from the outer ring 320 so that second empty space ES2 may be disposed between the upper surface of the insulating ring 330 and the outer ring 320, and fluid such as a process gas may pass through the second empty space ES2.

The baffle 400 be arranged in a ring shape by coming into contact with an outer wall of the upper focus ring 312, and may separate an upper space V1 and a lower space V2 in the chamber 100 by coming into contact with an outer wall of the chamber 100.

The baffle 400 may include a plurality of turbo molecular pumps (TMP) 401. The turbo molecular pumps 401 may form a vacuum by mechanically giving gas molecules a momentum in a specific direction and discharging the gas molecules in one direction for exhausting. For example, the passage of the fluid including the process gas in the third direction D3 may be controlled or hindered, and a pressure difference between the upper space V1 and the lower space V2 may be generated while forming the vacuum like the above.

The liner 410 may be disposed under the baffle 400 and may support the baffle 400. The liner 410 may be disposed in a ring shape by coming into contact with an outer side surface 320b of the outer ring 320. The liner 410 according to some embodiments may be grounded, and accordingly, the insulating ring 330 may insulate between the liner 410 and the lower electrode 220 to prevent the occurrence of arcing.

The liner 410 may include a through region 410PV, and a height of the lower surface of the through region 410PV may match a height of the lower end portion 330c2 of the outer ring 320, and as described later, a distance d between the through region 410PV and the baffle 400, may be within a range of 10 mm to 15 mm as described later.

Figure 5:
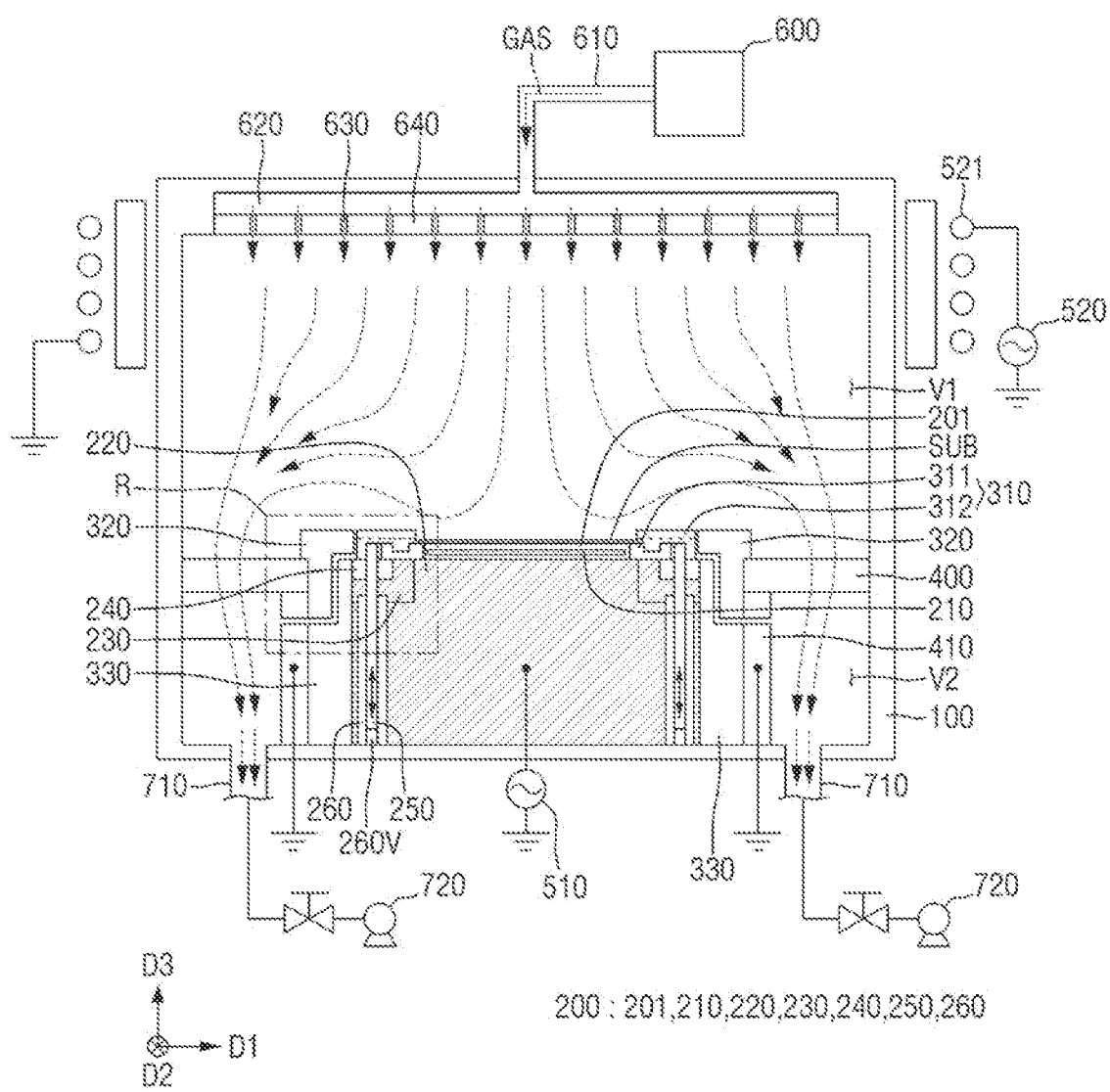
FIGS. 5 and 6 are views for describing a method of operating the plasma processing equipment, according to example embodiments of the present disclosure.
Figure 6:
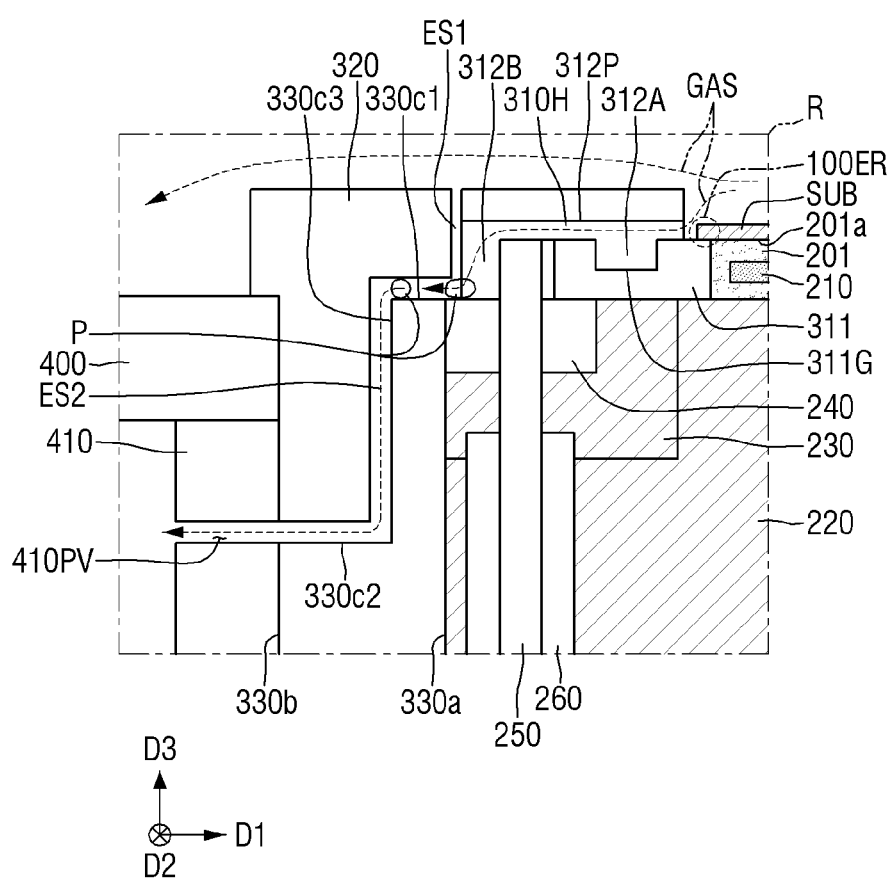

FIGS. 5 and 6 are views for describing a method of operating the plasma processing equipment 1 according to example embodiments of the present disclosure.

FIGS. 5 and 6 are views for describing a flow of the fluid GAS in the plasma processing equipment 1. FIG. 6 is an enlarged view of region R in FIG. 5.

The fluid GAS including a process gas or the like may be supplied from the gas supply 600 at the outside of the chamber 100 and the predetermined fluid GAS may be injected through the buffer chamber 620 and the gas shower head 640. High frequency power may be applied to the upper electrode and the lower electrode 220 in the chamber 100 to form an electric field, and the fluid GAS supplied into an enclosed space may be activated by the electric field to be in a plasma state.

The baffle 400 may set a pressure Pa of the fluid in the upper space V1 to be higher than a pressure Pb of the fluid in the lower space (V2), and accordingly, a pressure at the upper end portion 330c*l* of the outer ring 320 may be higher than a pressure at the lower end portion 330c2. A pressure in the outermost region 100ER may be higher than a pressure in the through region 410PV of the liner 410.

The plasma fluid GAS may pass directly from the upper space V1 through the baffle 400 to the lower space V2, and may move in parallel with a first direction D1 along the upper surface of the substrate SUB and then may move to the lower space V2 through the baffle 400.

In addition, some of the plasma fluid GAS may pass through the outermost region 100ER and the fluid hole 310H to reach the inner side surface 330a of the insulating ring 330, and the fluid GAS may move in a direction from the upper end portion 330c*l* to the lower end portion 330c2 along the upper surface of the insulating ring 330 due to a pressure difference between the upper end portion 330c*l* and the lower end portion 330c2. The fluid GAS passing through the lower end portion 330c2 passes through the through region 410PV of the liner 410 and moves to the lower space V2.

When the fluid GAS moves, the fluid GAS may move a polymer P, which is a by-product, between the process gas and the arcing prevention ring 240, to the lower space V2 by passing through the through region 410PV of the liner 410.

An arcing phenomenon caused by the polymer P accumulated on the arcing prevention ring 240 may be prevented through the movement of the fluid GAS.

Figure 7:
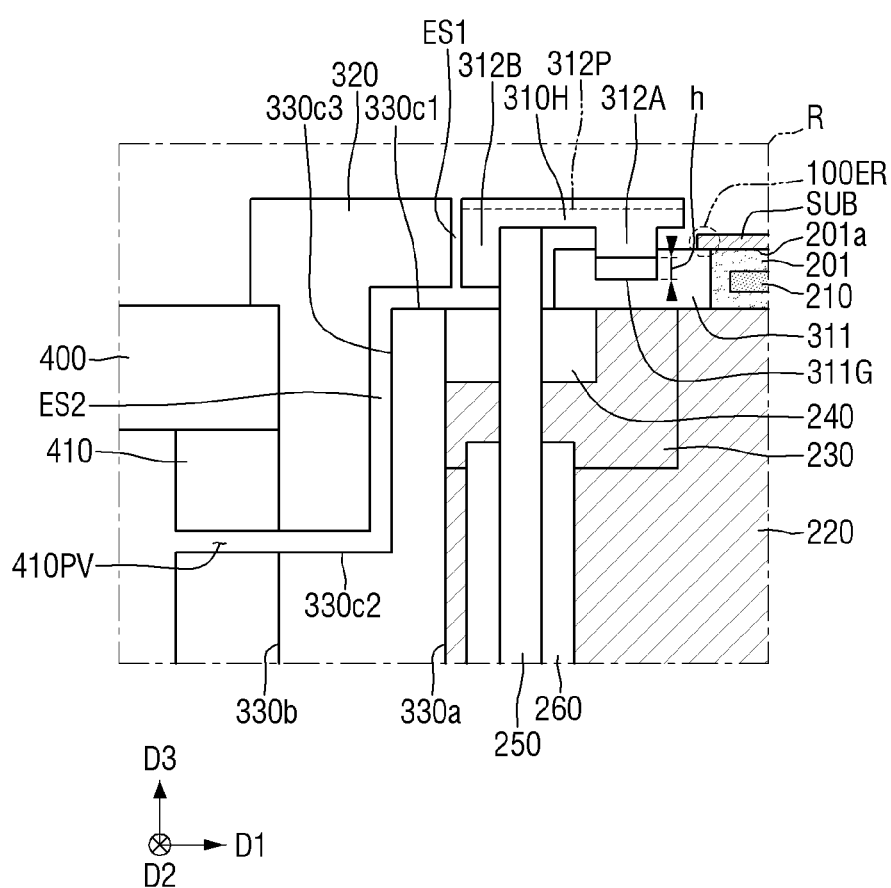
FIG. 7 is a view for describing a method of operating a mover included in the plasma processing equipment, according to example embodiments of the present disclosure.

FIG. 7 is a view for describing a method of operating the mover 250 included in the plasma processing equipment 1 according to example embodiments of the present disclosure.

When a process is performed in the plasma processing equipment 1, since etching is performed in the upper focus ring 312 in addition to the substrate SUB, a thickness may be reduced. For example, when the thickness of the upper focus ring 312 is etched by h, since the mover 250 rises by h in the third direction D3 along the vertical movement space 260V in the mover holder 260, the height relationship between the upper surface of the upper focus ring 312 and the upper surface of the outer ring 320 may be compensated.

Due to the third direction D3 of the mover 250, the first protruding portion 312A of the upper focus ring 312 may rise by h in the third direction D3 along the groove 311G of the lower focus ring 311.

Figure 8:
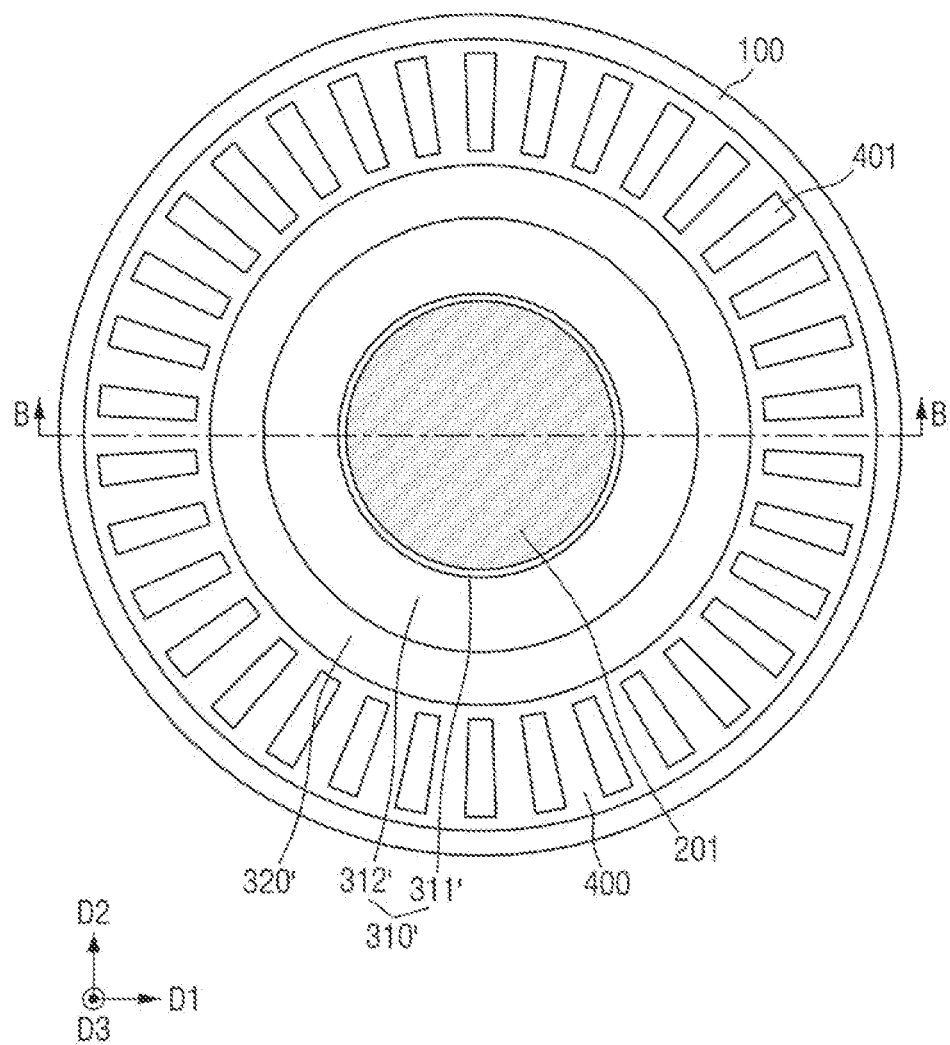
FIGS. 8 to 10 are views for describing plasma processing equipment, according to example embodiments of the present disclosure.
Figure 9:
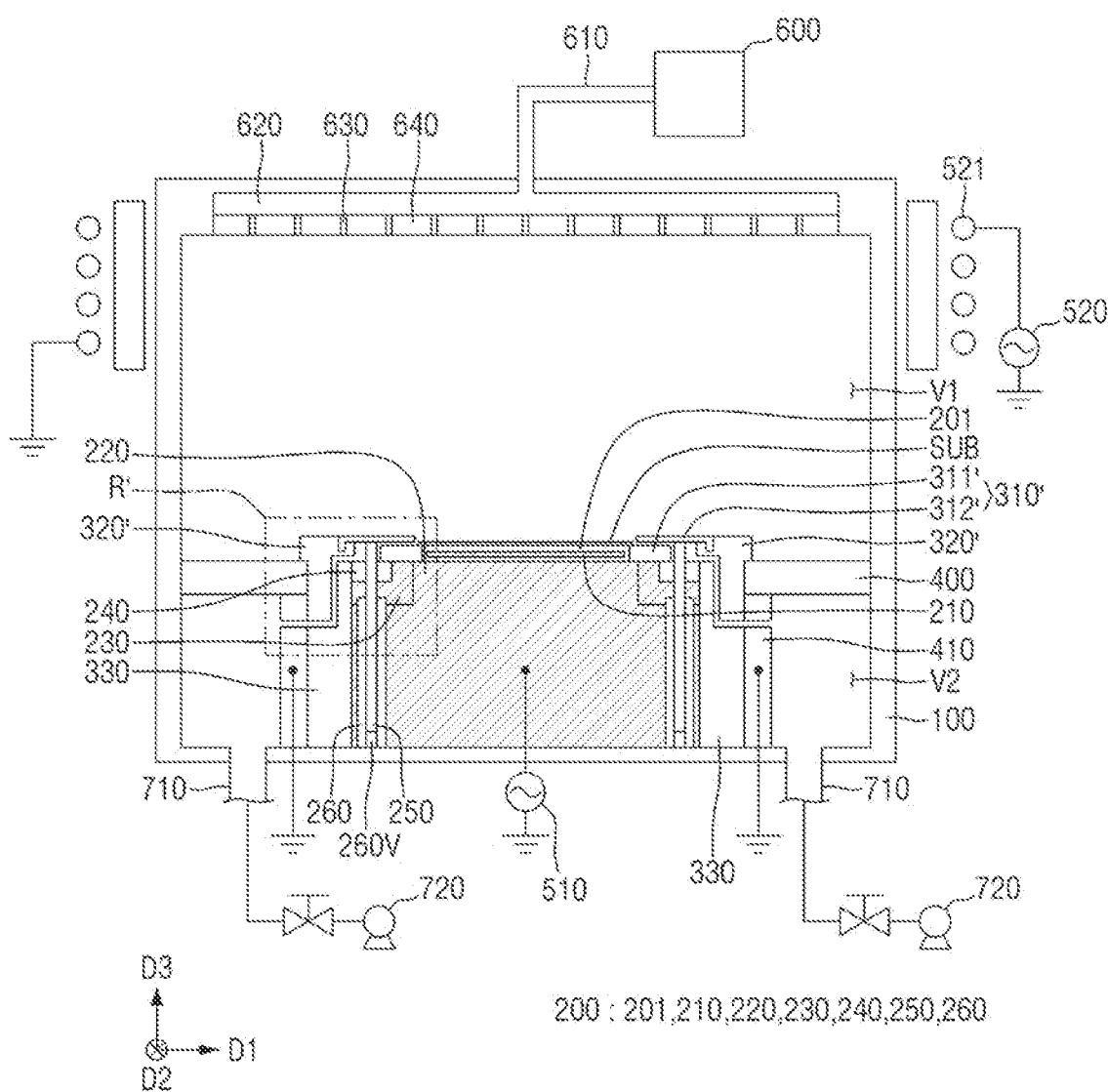
Figure 10:
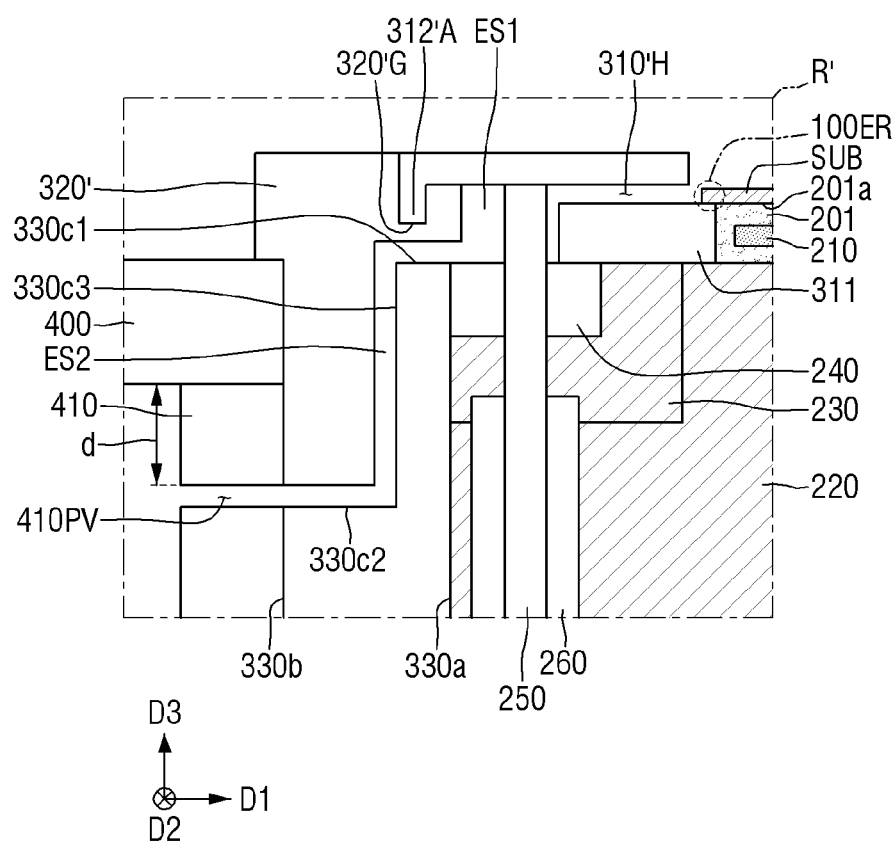

FIGS. 8 to 10 are views for describing plasma processing equipment 2 according to example embodiments of the present disclosure. FIG. 9 is a cross-sectional view illustrating a cross-section taken along line B-B in FIG. 8. FIG. 10 is an enlarged view of region R' in FIG. 9.

Hereinafter, the plasma processing equipment 2 according to example embodiments of the present disclosure will be described with reference to FIGS. 8 to 10. A description will be given focusing on differences with the plasma processing equipment 1 shown in FIGS. 1 to 4.

An upper focus ring 312' may include a third protruding portion 312'A, and when compared to the upper focus ring 312 in the plasma processing equipment 1 in FIGS. 1 to 4, the upper focus ring 312' may have an L shape, and may not include the through pattern 312P (see FIG. 4).

When compared to the lower focus ring 311 in the plasma processing equipment 1 in FIGS. 1 to 4, a lower focus ring 311' may not include the same configuration as the groove 311G, and an entire upper surface of the lower focus ring 311' may extend in the first direction D1. The lower focus ring 311' may support at least a part of the substrate SUB.

Accordingly, a fluid hole 310'H may be formed in a separated space between the upper focus ring 312' and the lower focus ring 311' through structures of the upper focus ring 312' and the lower focus ring 311'.

An outer ring 320' may further include a groove 320'G in comparison with the outer ring 320 in the plasma processing equipment 1 in FIGS. 1 to 4. A third protruding portion 312'A of the upper focus ring 312' may be disposed in the groove 320'G. Accordingly, the upper focus ring 312' may be supported through the groove 320'G and the mover 250.

Further, when the upper focus ring 312' is vertically moved by the mover 250, the third protruding portion 312'A of the upper focus ring 312' may vertically move along the groove 320'G.

In addition, in comparison with the plasma processing equipment 1 in FIGS. 1 to 4, when the plasma processing equipment 1 is viewed from a plan view, at least a part of the arcing prevention ring 240 does not overlap the upper focus ring 312 and the outer ring 320 and thus is exposed to the upper space V1 in the chamber 100, but when the plasma processing equipment 2 is viewed from a plan view, since the third protruding portion 312'A of the upper focus ring 312' overlaps the outer ring 320', the arcing prevention ring 240 disposed on the electrode expanding ring 230 may not be exposed.

Figure 11:
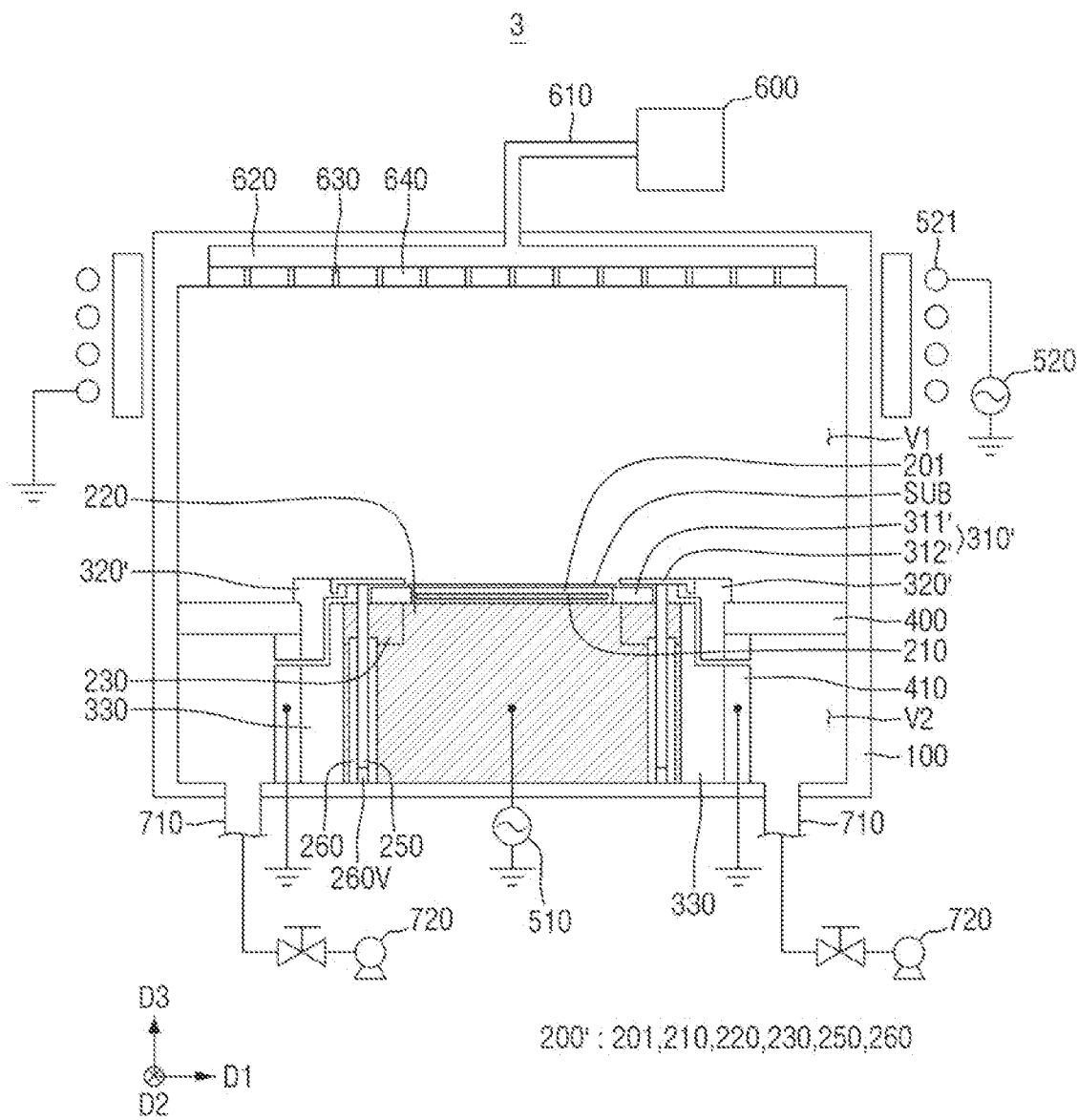
FIG. 11 is a view for describing plasma processing equipment, according to example embodiments of the present disclosure.

FIG. 11 is a view for describing plasma processing equipment 3 according to example embodiments of the present disclosure.

Hereinafter, the plasma processing equipment 3 according to example embodiments of the present disclosure will be described with reference to FIG. 11. A description will be given focusing on differences with the plasma processing equipment 2 shown in FIGS. 8 to 10.

A substrate support 200' according to some embodiments may not include an arcing prevention ring in comparison with the substrate support 200 of the plasma processing equipment 2.

Accordingly, an upper surface of the electrode expanding ring 230 may extend in the first direction D1 to become one flat surface, and the height of the entire upper surface of the electrode expanding ring 230 may be equal to or greater than the height of the upper surface of the lower electrode 220.

Further, the height of the entire upper surface of the electrode expanding ring 230 may be equal to or greater than the height of the upper surface of the insulating ring 330.

FIGS. 12 and 13 are views for describing an effect of the plasma processing equipment according to example embodiments of the present disclosure.

Referring to FIG. 12, a case in which the through region 410PV in the liner 410 is not present refers to a case in which the fluid GAS does not pass through the focus ring 310, and follows the profile of the focus ring 310 or is discharged through only the sidewall in the chamber 100.

Since the through region 410PV is not present, a flow velocity and a flow rate in the through region 410PV may not be measured, but when the fluid GAS is not discharged through the through region 410PV, the flow velocity in the outermost region 100ER adjacent to the focus ring 310 may be zero.

When a process is performed in the plasma processing equipment, since by-products of the substrate SUB may be accumulated in the outermost region 100ER, the flow velocity of the fluid GAS may be reduced due to the accumulation of by-products in the outermost region 100ER.

Accordingly, it can be seen that the flow velocity in the outermost region 100ER may be improved when the fluid GAS is discharged into the chamber along the upper surface of the insulating ring 330 by passing through the focus ring 310.

When the through region 410PV in the liner 410 has a distance d of 15 mm based on the baffle 400, the flow velocity of the fluid GAS in the outermost region 100ER is 0.0235 m/s, and the flow velocity in the through region 410PV in the liner 410 is 0.00628 m/s, and the flow rate flowing in the through region 410PV is 3.39 $E^{-10}$ kg/s.

When the through region 410PV in the liner 410 has a distance d of 30 mm based on the baffle 400, the flow velocity of the fluid GAS in the outermost region 100ER is 0.0233 m/s, and the flow velocity in the through region 410PV in the liner 410 is 0.00541 m/s, and the flow rate flowing in the through region 410PV is 2.85 $E^{-10}$ kg/s. As the distance between the through region 410PV and the baffle 400 increases, a length of a separated space between the outer ring 320 and the insulating ring 330 through which the fluid GAS passes may increase. Since the fluid GAS may receive resistance according to the length of the elongated separated space, efficiency of the flow velocity in the through region 410PV and the flow rate flowing in the through region 410PV may be deteriorated in the case in which the through region 410PV in the liner 410 has the distance d of 30 mm based on the baffle 400 more than in the case in which the through region 410PV in the liner 410 has the distance d of 15 mm based on the baffle 400.

Accordingly, an appropriate distance is necessary between the through region 410PV in the liner 410 and the baffle 400, and the distance d between the through region 410PV in the liner 410 and the baffle 400 may be within 10 mm to 15 mm.

Referring to FIGS. 1, 2, and 13, when a diameter of the substrate SUB is R1, a middle point of the upper focus ring 312 may be referred to as R2, and an outer point of the upper focus ring 312 may be referred to as R3.

When the substrate support 200 does not include the electrode expanding ring 230, a voltage is maintained at R1 and R2, but the voltage tends to increase and decrease in comparison with the voltage at R1 and R2 as the distance increases from R2 to R3.

On the other hand, in the embodiments of the present disclosure in which the substrate support 200 includes the electrode expanding ring 230, it can be seen that the voltage is maintained in comparison with the voltage at R1 and R2 even when the distance increases from R2 to R3.

For example, when the electrode expanding ring 230 is not included, it can be seen that voltage tilting may occur in the upper focus ring 312 adjacent to the outermost region 100ER, and when the electrode expanding ring 230 is included, the voltage tilting may be improved.

Further, in the plasma processing equipment according to some embodiments, since the mover 250 passing through the electrode expanding ring 230 may adjust the height of the upper focus ring 312 to improve the voltage tilting in the upper focus ring 312, the voltage tilting of the outermost region 100ER may be effectively improved.

In the plasma processing equipment according to some embodiments, the flow velocity and the voltage tilting at the outermost region 100ER can be improved.

However, the effects of the embodiments are not restricted to the ones set forth herein. The above and other effects of the embodiments will become more apparent to one of daily skill in the art to which the present disclosure pertains by referencing the claims.

What is claimed is:

1. Plasma processing equipment comprising:
    a substrate support having an upper surface on which a substrate is seated;
    a focus ring disposed in a ring shape along an edge of the upper surface of the substrate support, and including a fluid hole;
    an insulating ring surrounding an outer sidewall of the substrate support and including an inner side surface facing the outer sidewall of the substrate support, an outer side surface facing the inner side surface, and an upper surface connecting the inner side surface and the outer side surface, wherein the upper surface of the insulating ring includes an upper end portion and a lower end portion having different heights, and a connection end portion connecting the upper end portion of the upper surface of the insulating ring and the lower end portion of the upper surface of the insulating ring;
    an outer ring disposed on the insulating ring in a ring shape along an edge of the focus ring;
    a liner surrounding the outer side surface of the insulating ring;
    a baffle disposed on an upper surface of the liner,
    a first empty space between the outer ring and the focus ring; and
    a second empty space between the upper surface of the insulating ring and the outer ring, the second empty space connected to the first empty space,
    wherein a fluid passing through the fluid hole flows along the upper surface of the insulating ring,
    wherein the baffle generates a pressure difference of the fluid between the upper end portion of the upper surface of the insulating ring and the lower end portion of the upper surface of the insulating ring,
    wherein the second empty space includes a first portion between the upper end portion of the upper surface of the insulating ring and the outer ring, a second portion between the lower end portion of the upper surface of the insulating ring and the outer ring, and a third portion between the connection end portion of the upper surface of the insulating ring and the outer ring,
    wherein an upper surface of the outer ring is above an upper surface of the substrate support,
    wherein the first empty space and the second empty space are connected to the fluid hole, and
    wherein an uppermost surface of the focus ring is above the substrate.

2. The plasma processing equipment of claim 1, wherein the focus ring supports at least a part of the substrate.

3. The plasma processing equipment of claim 1,
    wherein the focus ring includes a lower focus ring configured to support at least a part of the substrate, and an upper focus ring separated from the lower focus ring and having at least a part disposed on the lower focus ring, and
    wherein the insulating ring does not overlap the lower focus ring in a plan view.

4. The plasma processing equipment of claim 3, wherein the fluid hole is disposed between the upper focus ring and the lower focus ring.

5. The plasma processing equipment of claim 3, further comprising:

a mover disposed under the upper focus ring and passing through the substrate support to adjust a height of the upper focus ring,
wherein the mover is disposed between the insulating ring and the substrate support.

6. The plasma processing equipment of claim 3, wherein the upper focus ring is spaced apart from the substrate.

7. The plasma processing equipment of claim 1, wherein the substrate support includes an electrostatic chuck disposed under the substrate, and a lower electrode disposed under the electrostatic chuck and providing power to the electrostatic chuck.

8. The plasma processing equipment of claim 7, further comprising:
an electrode expanding ring disposed under the focus ring, and having an upper surface disposed higher than or equal to an upper surface of the lower electrode.

9. The plasma processing equipment of claim 1,
wherein the fluid flows along a through region passing through the liner, and
wherein a height of a lower surface of the through region is the same as a height of the lower end portion of the upper surface of the insulating ring.

10. The plasma processing equipment of claim 9, wherein the liner is grounded.

11. Plasma processing equipment comprising:
a substrate support including an upper surface on which a substrate is seated, and a lower electrode disposed under the substrate;
a focus ring disposed in a ring shape along an edge of the upper surface of the substrate support, and including a lower focus ring configured to support at least a part of the substrate, an upper focus ring separated from the lower focus ring and having at least a part disposed on the lower focus ring, and a fluid hole;
an electrode expanding ring disposed under the lower focus ring, and having an upper surface disposed higher than or equal to an upper surface of the lower electrode;
a mover passing through the electrode expanding ring, and disposed under the upper focus ring to adjust a height of the upper focus ring;
an insulating ring surrounding an outer sidewall of the substrate and including an inner side surface facing the outer sidewall of the substrate support, an outer side surface facing the inner side surface, and an upper surface connecting the inner side surface and the outer side surface, wherein the upper surface of the insulating ring includes an upper end portion and a lower end portion having different heights, and a connection end portion connecting the upper end portion of the upper surface of the insulating ring and the lower end position of the upper surface of the insulating ring;
an outer ring disposed on the insulating ring in a ring shape along an edge of the focus ring;
a first empty space between the outer ring and the focus ring, and
a second empty space between the upper surface of the insulating ring and the outer ring,
wherein the second empty space includes a first portion between the upper end portion of the upper surface of the insulating ring and the outer ring, a second portion between the lower end portion of the upper surface of the insulating ring and the outer ring, and a third portion between the connection end portion of the upper surface of the insulating ring and the outer ring,
wherein an upper surface of the outer ring is above an upper surface of the substrate support,
wherein the first empty space and the second empty space are connected to the fluid hole, and
wherein an uppermost surface of the focus ring is above the substrate.

12. The plasma processing equipment of claim 11, wherein the focus ring includes a fluid hole disposed between the upper focus ring and the lower focus ring.

13. The plasma processing equipment of claim 11, further comprising:
an arcing prevention ring disposed between the electrode expanding ring and the lower focus ring.

14. The plasma processing equipment of claim 13, wherein at least a part of the arcing prevention ring does not overlap the focus ring in a plan view.

15. The plasma processing equipment of claim 13,
wherein the mover passes through the arcing prevention ring, and
wherein the mover is disposed between the insulating ring and the substrate support.

16. Plasma processing equipment comprising:
a chamber in which a process is performed;
a substrate support configured to support a substrate in the chamber, and configured to support at least a part of a focus ring disposed in a ring shape along an edge of the substrate, wherein the focus ring includes a fluid hole;
an electrode expanding ring disposed between the focus ring and the substrate support in a separable form, and having an upper surface disposed higher than or equal to an upper surface of a lower electrode included in the substrate support;
an insulating ring surrounding an outer sidewall of the electrode expanding ring and including an inner side surface facing the outer sidewall of the electrode expanding ring, an outer side surface facing the inner side surface, and an upper surface connecting the inner side surface and the outer side surface, wherein the upper surface of the insulating ring includes an upper end portion and a lower end portion having different heights, and a connection end portion connecting the upper end portion of the upper surface of the insulating ring and the lower end portion of the upper surface of the insulating ring;
an outer ring disposed on the insulating ring in a ring shape along an edge of the focus ring;
a baffle disposed in a ring shape along an edge of the outer ring,
a first empty space between the outer ring and the focus ring; and
a second empty space between the upper surface of the insulating ring and the outer ring,
wherein a fluid passing through the fluid hole flows along the upper surface of the insulating ring from a space between the insulating ring and the outer ring,
wherein the baffle generates a pressure difference of the fluid between the upper end portion of the upper surface of the insulating ring, and the lower end portion of the upper surface of the insulting ring,
wherein the second empty space includes a first portion between the upper end portion of the upper surface of the insulating ring and the outer ring, a second portion between the lower end portion of the upper surface of the insulating ring and the outer ring, and a third portion between the connection end portion of the upper surface of the insulating ring and the outer ring,
wherein an upper surface of the outer ring is above an upper surface of the substrate support, wherein the first empty space and the second empty space are connected to the fluid hole, and wherein an uppermost surface of the focus ring is above the substrate.

17. The plasma processing equipment of claim 16, wherein the focus ring includes a lower focus ring configured to support at least a part of the substrate, and an upper focus ring separated from the lower focus ring and having at least a part disposed on the lower focus ring, and wherein the insulating ring does not overlap the lower focus ring in a plan view.

18. The plasma processing equipment of claim 17, wherein the outer ring includes a groove disposed in an upper surface thereof, wherein the at least a part of the upper focus ring is disposed in the groove, and wherein the fluid hole includes a separated space between the upper focus ring and the lower focus ring.

19. The plasma processing equipment of claim 17, further comprising:

a mover disposed under the upper focus ring, and passing through the electrode expanding ring to adjust a height of the upper focus ring, wherein the mover is disposed between the insulating ring and the substrate support.

20. The plasma processing equipment of claim 16, wherein a fluid pressure at the upper end portion is higher than a fluid pressure at the lower end portion.

* * * * *